United States Patent
Li (10) Patent No.: US 10,658,060 B2
(45) Date of Patent: May 19, 2020

(54) SHIFT REGISTER CIRCUIT AND SHIFT REGISTER UNIT

(71) Applicant: Wuhan China Star Optoelectronics Semiconductor Display Technology Co., Ltd., Wuhan, Hubei (CN)

(72) Inventor: Jun Li, Guangdong (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 243 days.

(21) Appl. No.: 15/754,146

(22) PCT Filed: Dec. 19, 2017

(86) PCT No.: PCT/CN2017/117143
§ 371 (c)(1),
(2) Date: Feb. 21, 2018

(87) PCT Pub. No.: WO2019/095492
PCT Pub. Date: May 23, 2019

(65) Prior Publication Data
US 2019/0385687 A1    Dec. 19, 2019

(30) Foreign Application Priority Data

Nov. 16, 2017 (CN) .......................... 2017 1 1163641

(51) Int. Cl.
*G11C 19/28* (2006.01)
*G09G 3/3266* (2016.01)
*G09G 3/36* (2006.01)

(52) U.S. Cl.
CPC .......... *G11C 19/28* (2013.01); *G09G 3/3266* (2013.01); *G09G 3/3677* (2013.01); *G09G 2300/0408* (2013.01); *G09G 2310/0286* (2013.01)

(58) Field of Classification Search
CPC .. G09G 3/3266; G09G 3/3674; G09G 3/3677; G09G 2300/0408; G09G 2310/0286; G11C 19/28
See application file for complete search history.

(56) References Cited

U.S. PATENT DOCUMENTS 9,105,234 B2 *   8/2015   Kim ..................... G11C 19/28
9,113,534 B2 *   8/2015   Kim ..................... G11C 19/184
(Continued)

FOREIGN PATENT DOCUMENTS

CN           102479552 A      5/2012
CN           102708799 A     10/2012
(Continued)

*Primary Examiner* — Patrick O Neill
(74) *Attorney, Agent, or Firm* — Hemisphere Law, PLLC; Zhigang Ma (57) ABSTRACT

The present disclosure provides a shift register circuit, adapted for connecting with a pixel-compensating circuit corresponding to the GOA unit. The shift register circuit comprises: an input module connecting with a signal input terminal, the input module is adapted for generating an output control signal based on an input signal supplied by the signal input terminal; a shift register module connecting with the input module, the shift register module is adapted for inverting the output control signal, so as to output an emission control signal toward a pixel-compensating circuit corresponding to the GOA unit; and wherein the shift register module includes a first capacitor, a second capacitor, a first transistor, a second transistor, a third transistor and a fourth transistor. The required amount of thin-film transistors (TFT) is small and entire PMOS design could save process and raise the production efficiency. The present application further provides a shift register unit.

15 Claims, 8 Drawing Sheets

(56) References Cited

U.S. PATENT DOCUMENTS

| | | | | |
|---|---|---|---|---|
| 9,754,531 B2* | 9/2017 | Ji | ............................ | G09G 3/32 |
| 9,966,957 B2* | 5/2018 | Zheng | .................. | G09G 3/3266 |
| 10,013,919 B2* | 7/2018 | Yang | .................... | G11C 19/28 |
| 10,095,355 B2* | 10/2018 | Yang | .................... | G06F 3/0418 |
| 10,204,560 B2* | 2/2019 | Yang | .................... | G09G 3/3225 |
| 10,276,117 B2* | 4/2019 | Yang | .................... | G09G 3/3688 |
| 2018/0151122 A1* | 5/2018 | Ding | ................. | G06K 9/00993 |

FOREIGN PATENT DOCUMENTS

| | | | |
|---|---|---|---|
| CN | 102760407 | A | 10/2012 |
| CN | 102831860 | A | 12/2012 |
| CN | 102831861 | A | 12/2012 |
| CN | 103928056 | A | 7/2014 |
| CN | 104183219 | A | 12/2014 |
| CN | 104517577 | A | 4/2015 |
| CN | 104900192 | A | 9/2015 |
| CN | 105304021 | A | 2/2016 |
| CN | 105553462 | A | 5/2016 |
| CN | 105632561 | A | 6/2016 |
| CN | 106356034 | A | 1/2017 |
| CN | 106710544 | A | 5/2017 |
| KR | 20120044084 | A | 5/2012 |

* cited by examiner

SHIFT REGISTER CIRCUIT AND SHIFT REGISTER UNIT

RELATED APPLICATIONS

The present application is a National Phase of International Application Number PCT/CN2017/117143, filed on Dec. 19, 2017, and claims the priority of China Application No. 201711163641.9, filed on Nov. 16, 2017, the disclosure of which is incorporated herein by reference in its entirety.

FIELD OF THE DISCLOSURE

The present disclosure relates to a technical field of display, and more particularly, to a shift register circuit and a shift register unit utilizing the shift register circuit.

BACKGROUND

Gate Driver on Array (GOA) technology utilizes existing array process of the thin-film transistor liquid crystal display. The gate line scanning driver signal circuit is made on the array substrate of the thin-film transistor to attain the driving technology for the progressive line scanning on the gate. Wherein, GOA technology is also referred as to shift register technology. GOA technology can integrate the Gate circuit on a panel, which can dispense with the IC (Integrated Circuit) providing the gate potential signal. As for a flexible OLED (Organic Light-Emitting Diode) display, due to demand for compensating threshold voltage (Vth) of the thin-film transistor and mobility of electron and hole in the film, more gate signals are needed. Accordingly, it starts to be very difficult to provide gate signals from the exterior IC.

Therefore, a new type of shift register circuit and a shift register unit has to be provided.

SUMMARY

The present application is intended to provide a type of shift register circuit and a unit with the same. The shift register circuit need a small amount of thin-film transistors (TFT) and all the transistors herein are PMOS type, which are designed as saving process and raising the production efficiency.

In order to accomplish above purpose, a shift register circuit provided in the present application is used for connecting with a pixel-compensating circuit corresponding to the GOA unit, and the shift register circuit comprises: an input module connecting with a signal input terminal, and the input module generates an output control signal based on an input signal supplied by the signal input terminal; a shift register module connecting with the input module, and the shift register module is adapted for inverting the output control signal, so as to output an emission control signal toward a pixel-compensating circuit corresponding to the GOA unit; wherein the shift register module includes a first capacitor, a second capacitor, a first transistor, a second transistor, a third transistor and a fourth transistor; wherein a first source of the first transistor is coupled with a high level, a first gate of the first transistor connects with an output terminal of the input module and a first drain of the first transistor connects with a first terminal of the second capacitor; wherein a second source of the second transistor connects with a high level, a second gate of the second transistor connects with an output terminal of the input module, a second drain of the second transistor connects with a fourth source of the fourth transistor and there is the first capacitor jointed between the second gate and the second source; wherein a third source of the third transistor connects with the first drain, a third gate of the third transistor functions as an output terminal of the shift register module and a third drain of the third transistor is coupled with a low level; and wherein the fourth source further functions as an output terminal of the shift register module, a fourth gate of the fourth transistor connects with the first drain and a fourth drain of the fourth transistor is coupled with a low level.

Optionally, the input module includes a fifth transistor, a sixth transistor and a third capacitor, and wherein a fifth drain of the fifth transistor is coupled with input signals, a fifth source of the fifth transistor is coupled with a first terminal of the third capacitor, a sixth gate of the sixth transistor is coupled with the fifth source, and a sixth source of the transistor is coupled with a second terminal of the third capacitor.

Optionally, a first clock-signal supplying terminal and a second clock-signal supplying terminal is further included, wherein the input module connects with the first clock-signal supplying terminal and the second clock-signal supplying terminal, respectively, and wherein a fifth gate of the fifth transistor connects with the first clock-signal supplying terminal and a sixth drain of the sixth transistor connects with the second clock-signal supplying terminal.

Optionally, the second clock-signal supplying terminal connects with a second terminal of the second capacitor.

Optionally, the input module further includes a seventh transistor, an eighth transistor, a ninth transistor and a fourth capacitor, wherein a seventh source of the seventh transistor is coupled with a high level, a seventh drain of the seventh transistor connects with the sixth gate, and wherein an eighth source of the eighth transistor is coupled with a high level, an eighth gate of the eighth transistor connects with the seventh drain, and wherein a ninth source of the ninth transistor connects with a eighth drain of the eighth transistor, a ninth drain of the ninth transistor is coupled with a low level, and there is the fourth capacitor jointed between the ninth drain and the ninth source.

Optionally, the input module further includes a tenth transistor and a third clock-signal accessing terminal, a seventh gate of the seventh transistor connects with the third clock-signal accessing terminal, a ninth gate of the ninth transistor connects with the third clock-signal accessing terminal, and wherein a tenth gate of the tenth transistor connects with the ninth drain, a tenth drain of the tenth transistor connects with the sixth source, and wherein a tenth source of the tenth transistor is coupled with a high level.

Optionally, the input module further includes an eleventh transistor, the eleventh transistor is disposed between the sixth transistor, and wherein the seventh transistor and a gate of the eleventh transistor is coupled with a low level.

The present application further provides a shift register unit comprising a shift register circuit and a pulse signal generator, the pulse signal generator is used for sequentially making two pulse signals differing in phase shift by half pulse period, which is in turn a first pulse signal and a second pulse signal. The first pulse signal and the second pulse signal connect with the input module, respectively.

Specifically, the shift register unit of the present embodiment is integrated on a display panel.

The present application further provides a shift register unit, comprising: an input module, wherein an output terminal of the input module outputs a shift signal; a shift register module, wherein an input terminal of the shift register module connects with the output terminal of the input module; wherein the shift register module includes a first capacitor, a second capacitor, a first transistor, a second transistor, a third transistor and a fourth transistor; and a pulse signal generator used for sequentially making three pulse signals differing in phase shift by half pulse period, which is in turn a first pulse signal, a second pulse signal and a third pulse signal, wherein the first pulse signal, the second pulse signal and the third pulse signal connect with the input module, respectively.

A register shift circuit and a register shift unit is provided by the present application, through a shift register module disposed, then the shift register module connects with the input module, and the shift register module is adapted for inverting the output control signal, so as to output an emission control signal toward a pixel-compensating circuit corresponding to the GOA unit; wherein the shift register module includes a first capacitor, a second capacitor, a first transistor, a second transistor, a third transistor and a fourth transistor, and wherein a first gate of the first transistor connects with an output terminal of the input module and a first drain of the first transistor connects with a first terminal of the second capacitor; a second gate of the second transistor connects with an output terminal of the input module, a second drain of the second transistor connects with a fourth source of the fourth transistor and there is the first capacitor jointed between the second gate and the second source, and wherein a third source of the third transistor connects with the first drain, a third gate of the third transistor functions as an output terminal, a connected fourth gate of the fourth transistor functions as an output terminal and wherein a fourth gate of the fourth transistor connects with the first drain, accordingly, effective output of gate wave form at a high level is accomplished and a high level pulse width could be modulated.

BRIEF DESCRIPTION OF THE DRAWINGS

To more clearly illustrate embodiments of the application or technical solutions in the prior art, drawings to be used in the description of the embodiments of the application or the prior art will be briefly introduced hereinafter. Apparently, the drawings in the description below are merely some embodiments of the disclosure, a person skilled in the art can obtain other drawings according to these drawings without creative efforts. In the figures.

In order to understand the above objectives, features and advantages of the present disclosure more clearly, the present disclosure is described in detail below with references to the accompanying drawings and specific embodiments.

DETAILED DESCRIPTION OF PREFERRED EMBODIMENTS

It should be understood that the specific embodiments described herein only to explain the present invention and are not intended to limit the present invention.

Mass production of GOA (Gate Driver on Array) is accomplished by means of GOA technology to integrate the gate switch circuit on the array substrate of a display panel, thereby, the gate driver integrated circuit is omitted to reduce product cost from the cost of materials and production process. This type of gate switch circuit integrated on the array substrate by GOA technology is also referred as to GOA circuit. The present application is relative to a type of GOA shift register circuit with entire PMOS (positive channel Metal Oxide Semiconductor, p-channel metal-oxide-semiconductor field effect) transistors.

Figure 1:
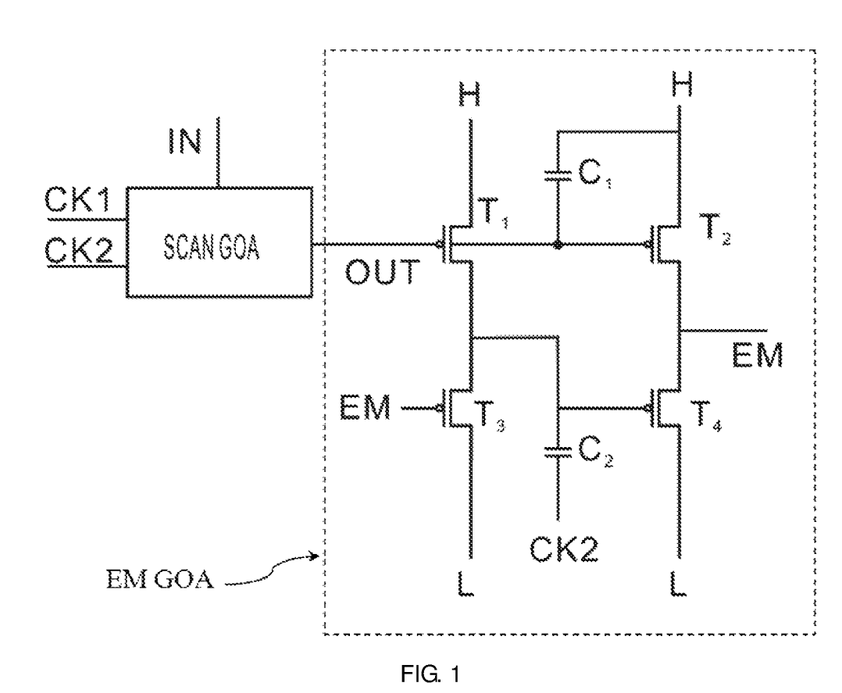
FIG. 1 is a schematic illustrating circuit structure according to the first embodiment of the shift register circuit in the present application.
Figure 2:
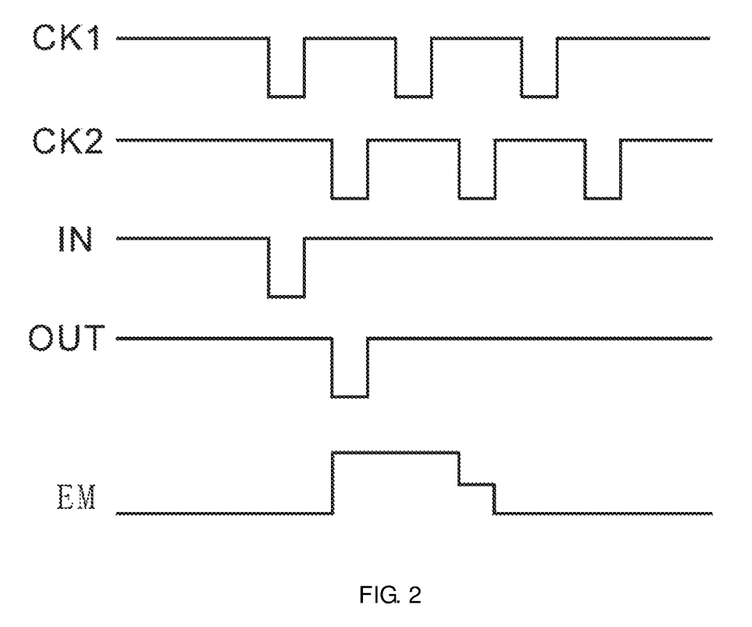
FIG. 2 is a schematic illustrating time sequence of the signals according to the first embodiment of the shift register circuit in the present application.

Please refer to FIG. 1 and FIG. 2, which are the first embodiment of the present application. All transistors in the present application are PMOS transistors. The shift register circuit comprises an input module SCAN GOA connecting with a signal input terminal IN, and the input module SCAN GOA generates an output control signal OUT based on an input signal supplied by the signal input terminal IN. In the present embodiment, the output control signal OUT is a shift signal of the input signal with a lagged phase, as shown in FIG. 2.

The shift register circuit further comprises a shift register module EM GOA connecting with the input module SCAN GOA, and the output control signal OUT is inputted into the shift register module EM GOA. The shift register module EM GOA is adapted for inverting the output control signal OUT, so as to output an emission control signal EM toward a pixel-compensating circuit corresponding to the GOA unit.

The shift register module EM GOA includes a first capacitor C1, a second capacitor C2, a first transistor T1, a second transistor T2, a third transistor T3 and a fourth transistor T4. A first source of the first transistor T1 is coupled with a high level H, a first gate of the first transistor T1 connects with an output terminal (i.e., the output control signal OUT) of the input module SCAN GOA and a first drain of the first transistor T1 connects with a first terminal of the second capacitor C2. A second source of the second transistor T2 connects with a high level H, a second gate of the second transistor T2 connects with an output terminal of the input module SCAN GOA, a second drain of the second transistor T2 connects with a fourth source of the fourth transistor T4 and there is the first capacitor C1 jointed between the second gate and the second source. A third source of the third transistor T3 connects with the first drain, a third gate of the third transistor T3 connects with an output terminal of the shift register module EM GOA and a third drain of the third transistor T3 is coupled with a low level. The fourth source further connects with an output terminal of the shift register module EM GOA, a fourth gate of the fourth transistor T4 connects with the first drain and a fourth drain of the fourth transistor T4 is coupled with a low level.

Please refer to FIG. 1 and FIG. 2, wherein a second clock-signal supplying terminal connects with a second terminal of the second capacitor C2 and the second clock-signal providing end is adapted for providing a second clock-signal CK2

Please refer to FIG. 1 and FIG. 2. Signal variations of the circuit in the present embodiment are shown as following steps:

In phase 1, output control signal OUT is outputted through interior circuit running in the input module SCAN GOA, when the input module SCAN GOA receives signals from the signal input terminal IN.

In phase 2, the output control signal OUT is of a low level, the first transistor T1 and the second transistor T2 are turn-on, the emission control signal EM becomes a high level, the third transistor T3 is turn-off and the fourth transistor T4 is turn-off.

In phase 3, when a second clock-signal CK2 is of a low level, a level of the fourth gate of the transistor T4 becomes a low level and the transistor T4 is turn-on, making the emission control signal EM at a low level.

Through the shift register module EM GOA, the output control signal OUT could become a backward signal and pulse width could be modulated, accordingly, the amount of transistors is reduced and entire PMOS design could save process and raise the production efficiency.

Figure 3:
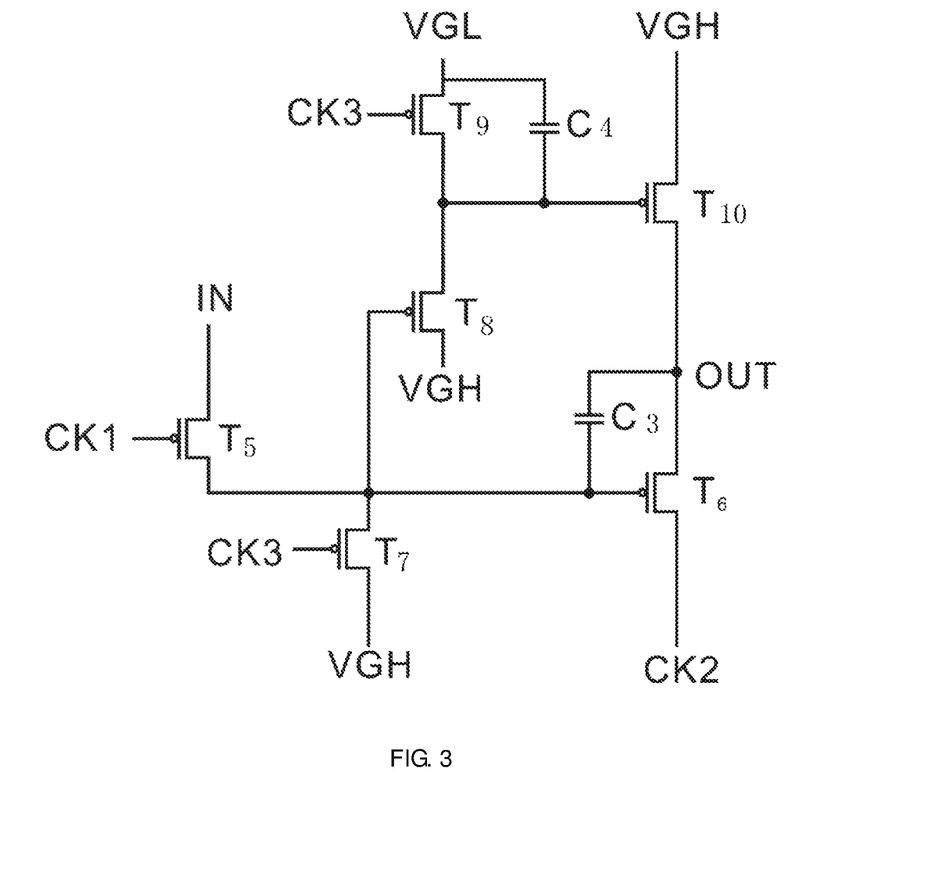
FIG. 3 is a schematic illustrating circuit structure of the input module SCAN GOA according to the second embodiment of the shift register circuit in the present application.

Please refer to FIG. 3, which is the second embodiment of the register circuit in the present application. There is a fifth transistor T5, a sixth transistor T6 and a third capacitor C3, disposed in the input module SCAN GOA. A fifth drain of the fifth transistor T5 is coupled with input signals from the signal input terminal IN and a fifth source of the fifth transistor T5 is coupled with a first terminal of the third capacitor C3. A sixth gate of the sixth transistor T6 is both coupled with the fifth source and one terminal of the third capacitor C3. A sixth source of the transistor T6 is coupled with a second terminal of the third capacitor C3.

Specifically, a first clock-signal supplying terminal and a second clock-signal supplying terminal are included. The input module SCAN GOA connects with the first clock-signal supplying terminal and the second clock-signal supplying terminal, respectively. A fifth gate of the fifth transistor T5 connects with the first clock-signal supplying terminal and a sixth drain of the sixth transistor T6 connects with the second clock-signal supplying terminal. The first clock-signal supplying terminal and the second clock-signal supplying terminal are adapted for supplying the first clock-signal CK1 and the second clock-signal CK2, respectively.

Specifically, there is a seventh transistor T7, an eighth transistor T8, a ninth transistor T9 and a fourth capacitor C4, disposed in the input module SCAN GOA. A seventh source of the seventh transistor T7 is coupled with a high level VGH and a seventh drain of the seventh transistor T7 connects with the sixth gate. An eighth source of the eighth transistor T8 is coupled with a high level VGH and an eighth gate of the eighth transistor T8 connects with the seventh drain. A ninth source of the ninth transistor T9 connects with a eighth drain of the eighth transistor T8, a ninth drain of the ninth transistor T9 is coupled with a low level VGL, and there is the fourth capacitor C4 jointed between the ninth drain and the ninth source.

Specifically, there is a tenth transistor T10 and a third clock-signal supplying terminal adapted for providing a third clock-signal, further disposed in the input module SCAN GOA. A seventh gate of the seventh transistor T7 connects with the third clock-signal supplying terminal, and a ninth gate of the ninth transistor T9 connects with the third clock-signal supplying terminal. A tenth gate of the tenth transistor T10 connects with the ninth drain, a tenth drain of the tenth transistor T10 connects with the sixth source and a tenth source of the tenth transistor T10 is coupled with a high level VGH.

In other embodiments, the input module SCAN GOA is controlled by two clock-signals or a plurality of clock-signals. The present second embodiment is merely one model of generating the shift register output.

Figure 4:
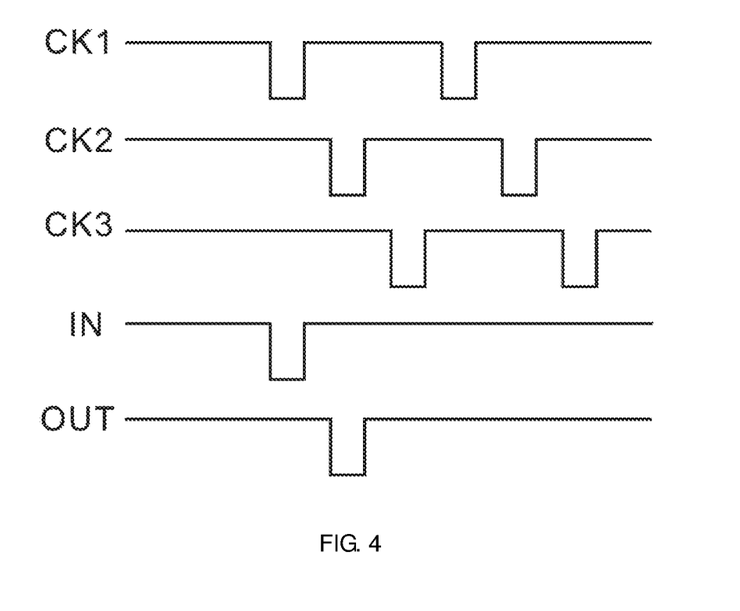
FIG. 4 is a schematic illustrating time sequence of the signals in the input module SCAN GOA according to the second embodiment of the shift register circuit in the present application.
Figure 7:
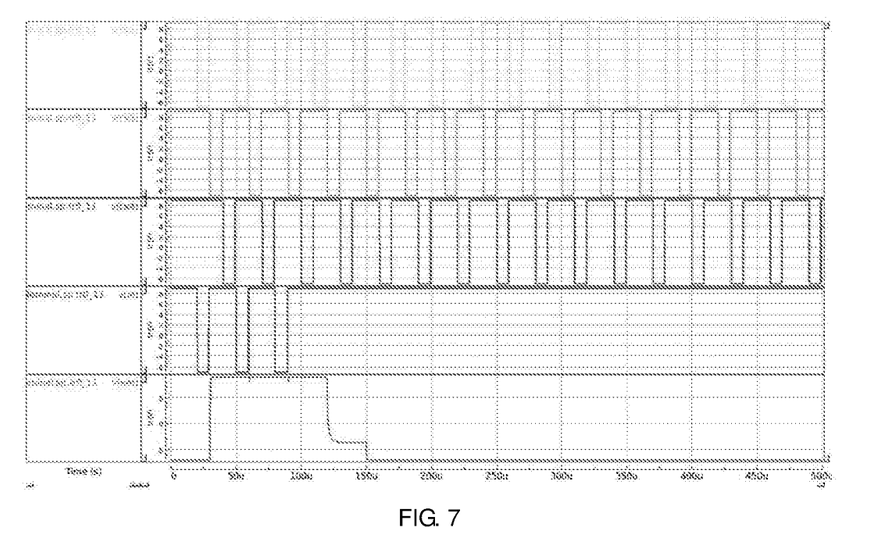
FIG. 7 is a schematic illustrating simulation and proof of function of the shift register circuit in the present application.
Figure 8:
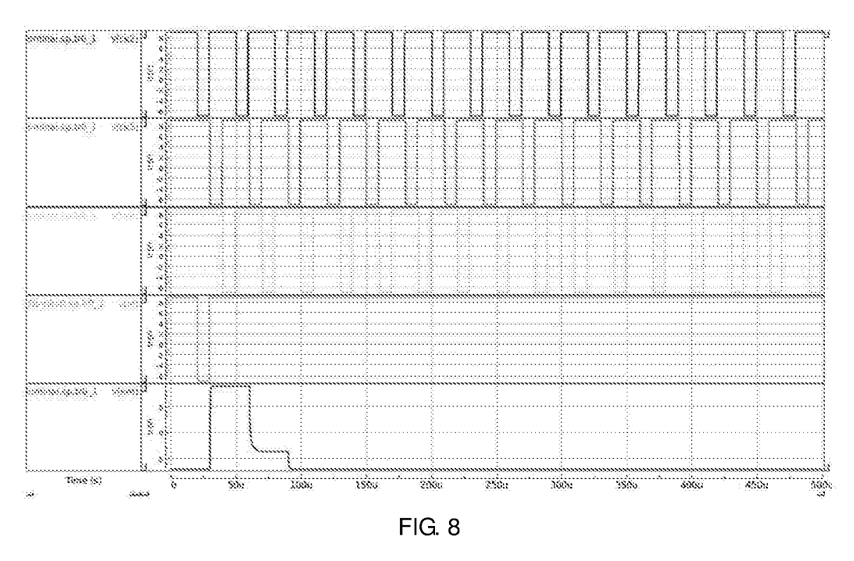
FIG. 8 is a schematic illustrating simulation of pulse modulation of the shift register circuit in the present application.

Please refer to FIG. 4, FIG. 7 and FIG. 8, signal steps in whole process of the input module SCAN GOA are shown as follows:

In phase 1, input signals of the signal input terminal IN in the input module SCAN GOA and the first clock-signal CK1 are of low levels, while the second clock-signal CK2 and the third clock-signal CK3 are of a high level. The fifth transistor T5, the eighth transistor T8 and the sixth transistor T6 are turn-on, while the seventh transistor T7, the ninth transistor T9 and the tenth transistor T10 are turn-off. The sixth gate of the sixth transistor T6 is of a low level. The output control signal OUT of the input module SCAN GOA is the second clock-signal CK2, then the output control signal OUT has output with a high level.

In phase 2, input signals of the signal input terminal IN in the input module SCAN GOA and the first clock-signal CK1 become high levels, while the second clock-signal CK2 is of a low level and the third clock-signal CK3 is of a high level. The fifth transistor T5, the seventh transistor T7, the ninth transistor T9 and the tenth transistor T10 are turn-off, while the eighth transistor T8 is still turn-on. The six gate of the sixth transistor T6, under action of the capacitor C3, is still of a low level. The output control signal OUT outputs the status of the second clock-signal CK2, and the second clock-signal CK2 is of a low level in this phase, then the output control signal OUT starts to output with a low level.

In phase 3, input signals of the signal input terminal IN in the input module SCAN GOA, the first clock-signal CK1 and the second clock-signal CK2 are of high levels, while the third clock-signal CK3 is of a low level. The fifth transistor T5, the eighth transistor T8, the sixth transistor T6 are turn-off, while the seventh transistor T7, the ninth transistor T9 and the tenth transistor T10 are turn-on, then the output control signal OUT outputs with a high level VGH passing through the tenth transistor T10.

Figure 5:
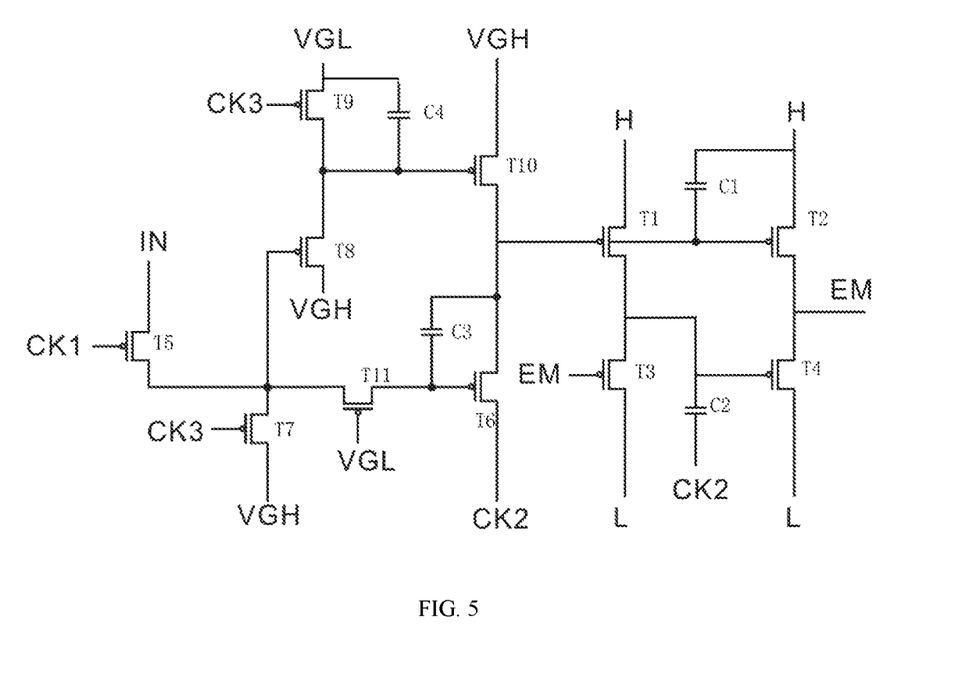
FIG. 5 is a schematic illustrating circuit structure according to the third embodiment of the shift register circuit in the present application.
Figure 6:
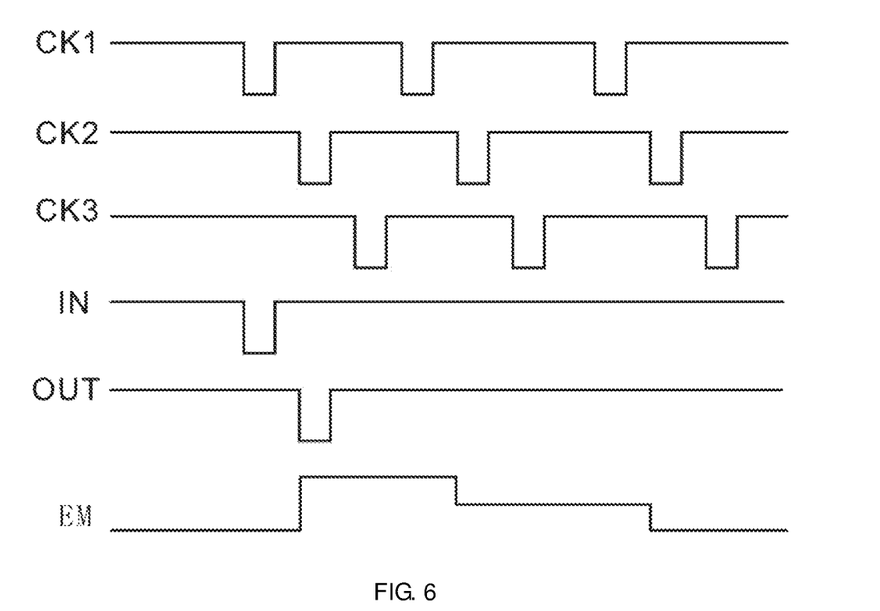
FIG. 6 is a schematic illustrating time sequence of the signals according to the third embodiment of the shift register circuit in the present application.

Please refer to FIG. 5 and FIG. 6, which is the third embodiment of the shift register circuit, wherein the difference between the third embodiment and the second embodiment is that there is an eleventh transistor T11 added between the sixth transistor T6 and the seventh transistor T7 and a gate of the eleventh transistor T11 is coupled with a low level VGL.

In one of the embodiments, the present application includes a type of shift register unit comprising pulse signal generator (not shown), wherein the pulse signal generator is adapted for sequentially making two pulse signals differing in phase shift by half pulse period, which is in turn a first pulse signal and a second pulse signal. The first pulse signal and the second pulse signal connect with the input module SCAN GOA, respectively.

Specifically, the shift register unit of the present embodiment is integrated on a display panel.

In one of the embodiments, the shift register unit of the present application comprises: an input module SCAN GOA, wherein an output terminal of the input module SCAN GOA outputs a shift signal (i.e., output control signal OUT); a shift register module EM GOA, wherein an input terminal of the shift register module EM GOA connects with the output terminal of the input module SCAN GOA, and there is a first capacitor C1, a second capacitor C2, a first transistor T1, a second transistor T2, a third transistor T3 and a fourth transistor T4, disposed in the shift register module EM GOA; and a pulse signal generator adapted for sequentially making three pulse signals differing in phase shift by half pulse period, which is in turn a first pulse signal, a second pulse signal and a third pulse signal, wherein the first pulse signal, the second pulse signal and the third pulse signal connect with the input module SCAN GOA, respectively.

Specifically, the shift register module of the present embodiment is integrated on a display panel.

In the present application, through the shift register module EM GOA, the input signal could become a backward signal. Effective output of gate wave form is accomplished via PMOS and a high level pulse width could be modulated, accordingly, the amount of thin-film transistors (TFT) is reduced and entire PMOS design could save process and raise the production efficiency.

This type of shift register circuit could be not only extensively applied in the thin film transistor liquid crystal display (TFT-LCD) but also in the driving circuit of AMO-LED (Active Matrix/Organic Light Emitting Diode panel Active Matrix/Organic Light Emitting Diode) panels.

It should also be noted that the terms "comprise", "include" and any other variations thereof intend to cover nonexclusive inclusion so that the procedure, the method, the product or the equipment including a series of elements include not only these elements, but also other elements which are not listed explicitly, or also include inherent elements of these procedure, method, product or equipment.

The sequence numbers of the embodiments are only intended for illustration but do not mean superior or inferior for the embodiments.

Above, with accompanying drawings, describes the embodiments of the present application, however the present application is not limited to above specific embodiments. The above-mentioned specific implementations are merely illustrative and can not be construed as a limitation. Those skilled in the art can make numerous modifications without departing from the gist of the method and the scope of the claims, which all belong to the scope of the present disclosure.

What is claimed is:

1. A shift register circuit, used for connecting with a pixel-compensating circuit corresponding to a GOA unit, wherein the shift register circuit comprises:
   an input module connecting with a signal input terminal, the input module is adapted for generating an output control signal based on an input signal supplied by the signal input terminal;
   a shift register module connecting with the input module, the shift register module is adapted for inverting the output control signal, so as to output an emission control signal toward the pixel-compensating circuit corresponding to the GOA unit; and
   wherein the shift register module comprises a first capacitor, a second capacitor, a first transistor, a second transistor, a third transistor and a fourth transistor;
   wherein a first source of the first transistor is coupled with a high level, a first gate of the first transistor connects with an output terminal of the input module, and a first drain of the first transistor connects with a first terminal of the second capacitor;
   wherein a second source of the second transistor connects with the high level, a second gate of the second transistor connects with an output terminal of the input module, a second drain of the second transistor connects with a fourth source of the fourth transistor, and the first capacitor is jointed between the second gate and the second source;
   wherein a third source of the third transistor connects with the first drain, a third gate of the third transistor connects with an output terminal of the shift register module, and a third drain of the third transistor is coupled with a low level; and
   wherein the fourth source of the fourth transistor further connects with an output terminal of the shift register module, a fourth gate of the fourth transistor connects with the first drain, and a fourth drain of the fourth transistor is coupled with the low level.

2. The shift register circuit according to claim 1, wherein the input module comprises a fifth transistor, a sixth transistor and a third capacitor, and wherein a fifth drain of the fifth transistor is coupled with the input signal, a fifth source of the fifth transistor is coupled with a first terminal of the third capacitor, a sixth gate of the sixth transistor is coupled with the fifth source, and a sixth source of the transistor is coupled with a second terminal of the third capacitor.

3. The shift register circuit according to claim 2, further comprising a first clock-signal supplying terminal and a second clock-signal supplying terminal, wherein the input module connects with the first clock-signal supplying terminal and the second clock-signal supplying terminal, respectively, and wherein a fifth gate of the fifth transistor connects with the first clock-signal supplying terminal, and a sixth drain of the sixth transistor connects with the second clock-signal supplying terminal.

4. The shift register circuit according to claim 3, wherein the second clock-signal supplying terminal connects with a second terminal of the second capacitor.

5. The shift register circuit according to claim 2, wherein the input module further comprises a seventh transistor, an eighth transistor, a ninth transistor and a fourth capacitor, and wherein a seventh source of the seventh transistor is coupled with the high level, a seventh drain of the seventh transistor connects with the sixth gate, and wherein an eighth source of the eighth transistor is coupled with the high level, an eighth gate of the eighth transistor connects with the seventh drain, and wherein a ninth source of the ninth transistor connects with an eighth drain of the eighth transistor, a ninth drain of the ninth transistor is coupled with the low level, and the fourth capacitor is jointed between the ninth drain and the ninth source.

6. The shift register circuit according to claim 5, wherein the input module further comprises a tenth transistor and a third clock-signal supplying terminal, a seventh gate of the seventh transistor connects with the third clock-signal supplying terminal, a ninth gate of the ninth transistor connects with the third clock-signal supplying terminal, and wherein a tenth gate of the tenth transistor connects with the ninth drain, a tenth drain of the tenth transistor connects with the sixth source, and wherein a tenth source of the tenth transistor is coupled with the high level.

7. The shift register circuit according to claim 5, wherein the input module further comprises an eleventh transistor, the eleventh transistor is disposed between the sixth transistor and the seventh transistor, and wherein a gate of the eleventh transistor is coupled with the low level.

8. A shift register unit comprising a shift register circuit, used for connecting with a pixel-compensating circuit corresponding to a GOA unit, wherein the shift register circuit comprises an input module and a shift register module, and wherein the input module connects with a signal input terminal, the input module is adapted for generating an output control signal based on an input signal supplied by the signal input terminal;

the shift register module connects with the input module, the shift register module is adapted for inverting the output control signal, so as to output an emission control signal toward the pixel-compensating circuit corresponding to the GOA unit; and wherein the shift register module comprises a first capacitor, a second capacitor, a first transistor, a second transistor, a third transistor and a fourth transistor;

wherein a first source of the first transistor is coupled with a high level, a first gate of the first transistor connects with an output terminal of the input module, and a first drain of the first transistor connects with a first terminal of the second capacitor;

wherein a second source of the second transistor connects with the high level, a second gate of the second transistor connects with an output terminal of the input module, a second drain of the second transistor connects with a fourth source of the fourth transistor, and the first capacitor is jointed between the second gate and the second source;

wherein a third source of the third transistor connects with the first drain, a third gate of the third transistor connects with an output terminal of the shift register module, and a third drain of the third transistor is coupled with a low level; and wherein the fourth source of the fourth transistor further connects with an output terminal of the shift register module, a fourth gate of the fourth transistor connects with the first drain, and a fourth drain of the fourth transistor is coupled with the low level; and wherein the shift register unit further comprises a pulse signal generator, the pulse signal generator is used for sequentially generating two pulse signals differing in phase shift by half pulse period, which are in turn a first pulse signal and a second pulse signal, the first pulse signal and the second pulse signal connect with the input module, respectively.

9. The shift register unit according to claim 8, wherein the shift register unit is integrated on a display panel.

10. The shift register unit according to claim 8, wherein the input module comprises a fifth transistor, a sixth transistor and a third capacitor, and wherein a fifth drain of the fifth transistor is coupled with the input signal, a fifth source of the fifth transistor is coupled with a first terminal of the third capacitor, a sixth gate of the sixth transistor is coupled with the fifth source, and a sixth source of the transistor is coupled with a second terminal of the third capacitor.

11. The shift register unit according to claim 10, further comprising a first clock-signal supplying terminal and a second clock-signal supplying terminal, wherein the input module connects with the first clock-signal supplying terminal and the second clock-signal supplying terminal, respectively, and wherein a fifth gate of the fifth transistor connects with the first clock-signal supplying terminal, and a sixth drain of the sixth transistor connects with the second clock-signal supplying terminal.

12. The shift register unit according to claim 11, wherein the second clock-signal supplying terminal connects with a second terminal of the second capacitor.

13. The shift register unit according to claim 10, wherein the input module further comprises a seventh transistor, an eighth transistor, a ninth transistor and a fourth capacitor, and wherein a seventh source of the seventh transistor is coupled with the high level, a seventh drain of the seventh transistor connects with the sixth gate, and wherein an eighth source of the eighth transistor is coupled with the high level, an eighth gate of the eighth transistor connects with the seventh drain, and wherein a ninth source of the ninth transistor connects with an eighth drain of the eighth transistor, a ninth drain of the ninth transistor is coupled with the low level, and the fourth capacitor is jointed between the ninth drain and the ninth source.

14. The shift register unit according to claim 13, wherein the input module further comprises a tenth transistor and a third clock-signal supplying terminal, a seventh gate of the seventh transistor connects with the third clock-signal supplying terminal, a ninth gate of the ninth transistor connects with the third clock-signal supplying terminal, and wherein a tenth gate of the tenth transistor connects with the ninth drain, a tenth drain of the tenth transistor connects with the sixth source, and wherein a tenth source of the tenth transistor is coupled with the high level.

15. The shift register unit according to claim 13, wherein the input module further comprises an eleventh transistor, the eleventh transistor is disposed between the sixth transistor and the seventh transistor, and wherein a gate of the eleventh transistor is coupled with the low level.

* * * * *